(12) United States Patent
Fuks et al.

(10) Patent No.: US 8,947,282 B1
(45) Date of Patent: Feb. 3, 2015

(54) METHOD AND APPARATUS FOR A CURRENT CONTROL

(75) Inventors: Luiz Felipe Fuks, Fremont, CA (US); Elango Pakriswamy, San Jose, CA (US); Nicolas Monier, San Francisco, CA (US); Chun-Sup Kim, San Jose, CA (US)

(73) Assignee: Ikanos Communications, Inc., Fremont, CA (US)

( * ) Notice: Subject to any disclaimer, the term of this patent is extended or adjusted under 35 U.S.C. 154(b) by 1051 days.

(21) Appl. No.: 12/931,018

(22) Filed: Jan. 20, 2011

Related U.S. Application Data

(60) Provisional application No. 61/296,612, filed on Jan. 20, 2010.

(51) Int. Cl.
*H03M 1/78* (2006.01)

(52) U.S. Cl.
USPC .............................. 341/154; 341/155; 341/153

(58) Field of Classification Search
CPC ................................ H03M 1/00; H03M 1/745
USPC .......................................... 341/155, 153, 154
See application file for complete search history.

(56) References Cited

U.S. PATENT DOCUMENTS

| | | | | |
|---|---|---|---|---|
| 4,555,599 A * | 11/1985 | Hackett-Jones et al. | ....... | 379/345 |
| 4,562,525 A * | 12/1985 | Ferry et al. | ....... | 363/45 |
| 6,100,834 A * | 8/2000 | Lewyn | ........... | 341/155 |
| 6,760,424 B1 | 7/2004 | Rezvani et al. | | |
| 6,987,851 B1 | 1/2006 | Toumani et al. | | |
| 7,719,454 B2 * | 5/2010 | Minerva | ......... | 341/144 |
| 7,969,167 B2 * | 6/2011 | Khanna et al. | ........... | 324/686 |
| 8,094,055 B2 * | 1/2012 | Gaknoki | ....... | 341/153 |
| 2004/0174982 A1 * | 9/2004 | Apfel | ........... | 379/377 |
| 2006/0218422 A1 * | 9/2006 | Camagna et al. | ........... | 713/300 |
| 2007/0260904 A1 * | 11/2007 | Camagna et al. | ........... | 713/310 |
| 2008/0218394 A1 * | 9/2008 | Minerva | ........ | 341/145 |
| 2010/0188278 A1 * | 7/2010 | Khanna et al. | ........... | 341/172 |

* cited by examiner

*Primary Examiner* — Jean B Jeanglaude
(74) *Attorney, Agent, or Firm* — Pillsbury Winthrop Shaw Pittman LLP

(57) ABSTRACT

A current controller includes impedance elements coupled to form at least one impedance ladder circuit which exhibits a fixed impedance at an input and current divider steps each differing in a current magnitude by a multiple of three with respect to the current magnitude in an adjacent less significant step. Single pole triple throw (SPTT) switchably couple an associated step in the impedance ladder circuit to one of three outputs. Three discrete current sources or sinks are each coupled to a corresponding one of the outputs of each of the SPTT switches. The digital driver is coupled to each control input of each SPTT switch to additively deliver selected ones of the stepped currents from each step of the impedance ladder circuit to a corresponding selected one of the current sources or sinks.

15 Claims, 6 Drawing Sheets

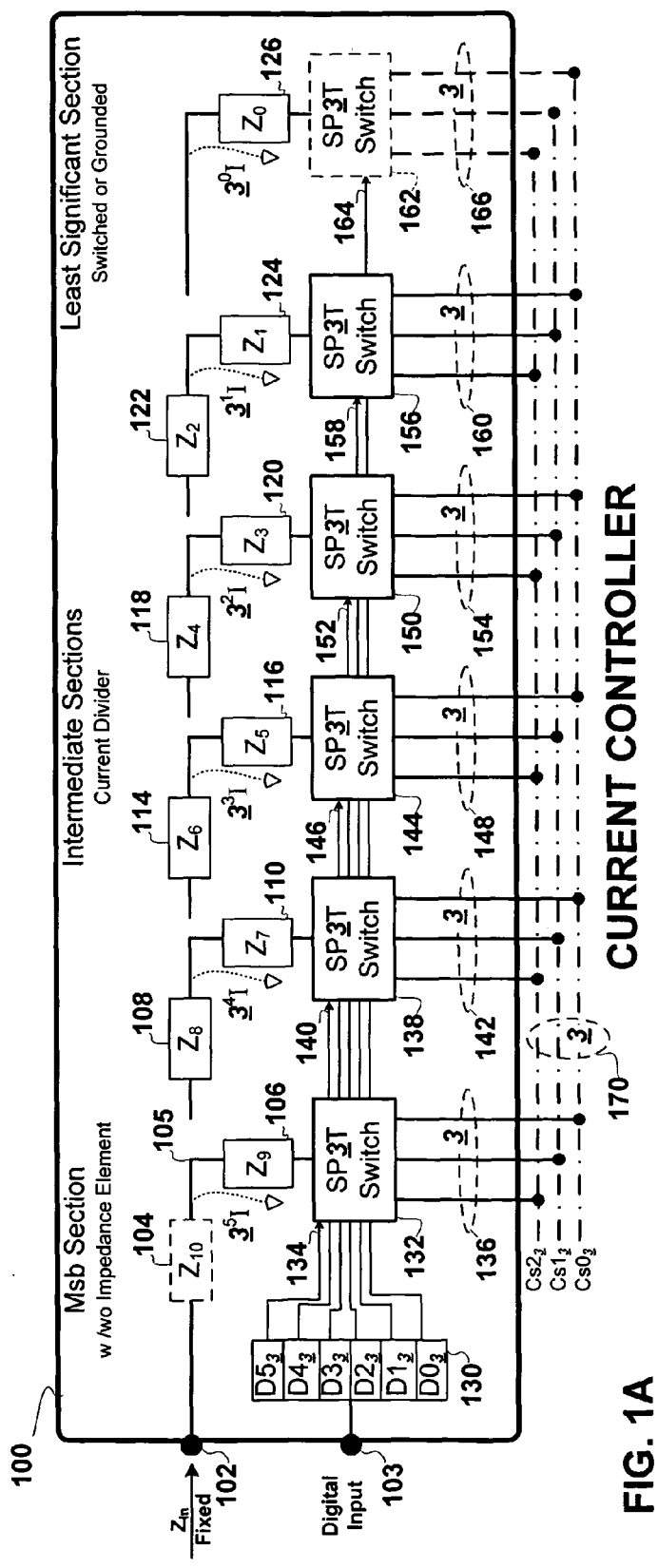
FIG. 1A
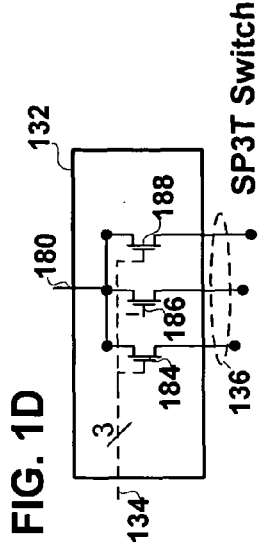
FIG. 1D
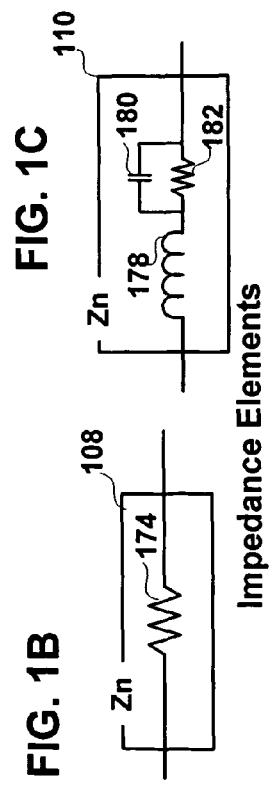
FIG. 1C
FIG. 1B

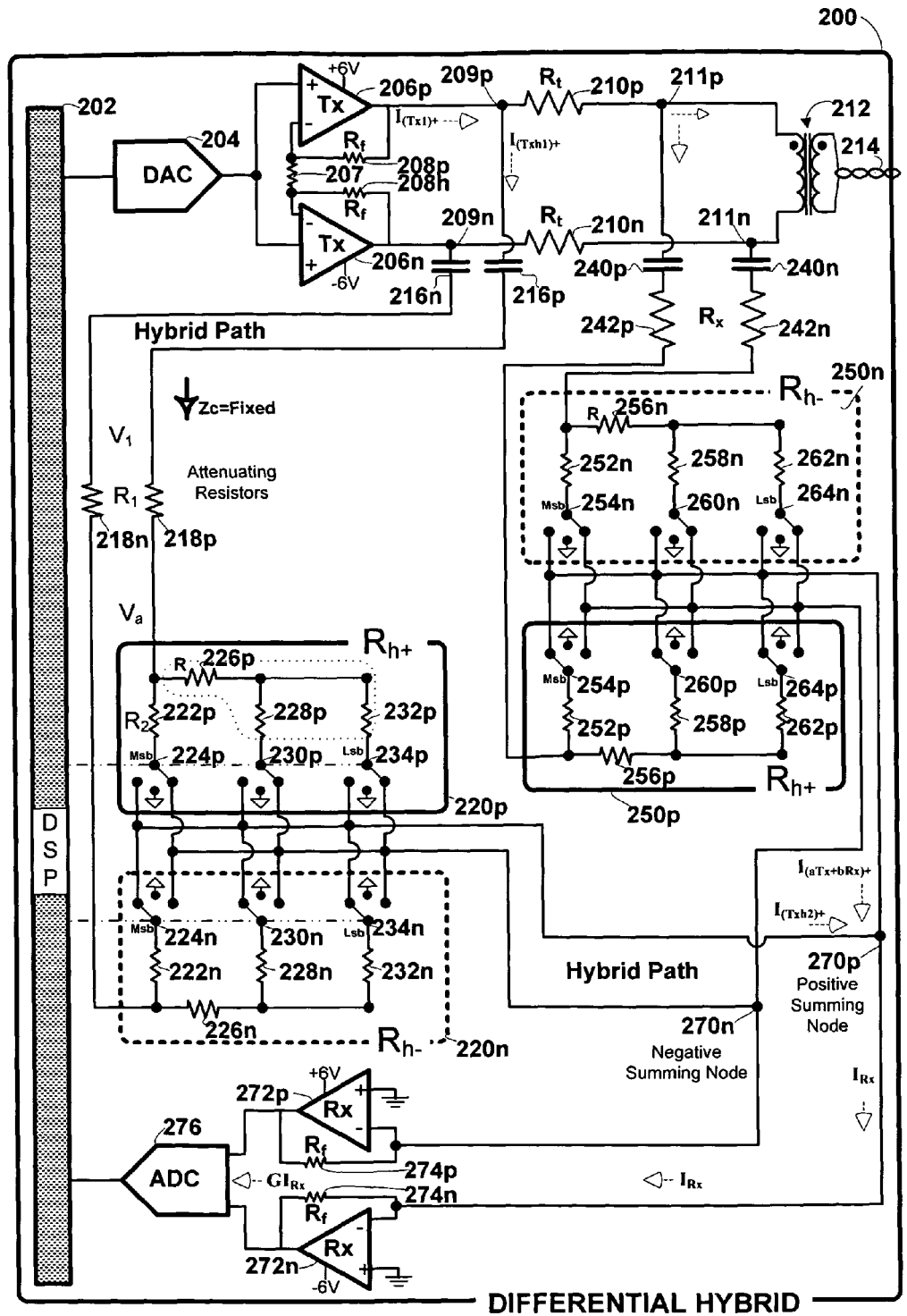
FIG. 2A — DIFFERENTIAL HYBRID
Current Controllers for Hybrid & Gain

CURRENT CONTROLLERS
FOR HYBRID AND GAIN CONTROL ( +1, +1, +1 )
+13 I
−13 I
( −1, −1, −1 )

( 0, +1, +1 )
+4 I
−4 I
( 0, −1, −1 )

( 0, +1, −1 )
+2 I
−2 I
( 0, −1, +1 )

( −1, +1, +1 )
−5 I
+5 I
( +1, −1, −1 )

SWITCHING FOR
CURRENT CONTROLLER

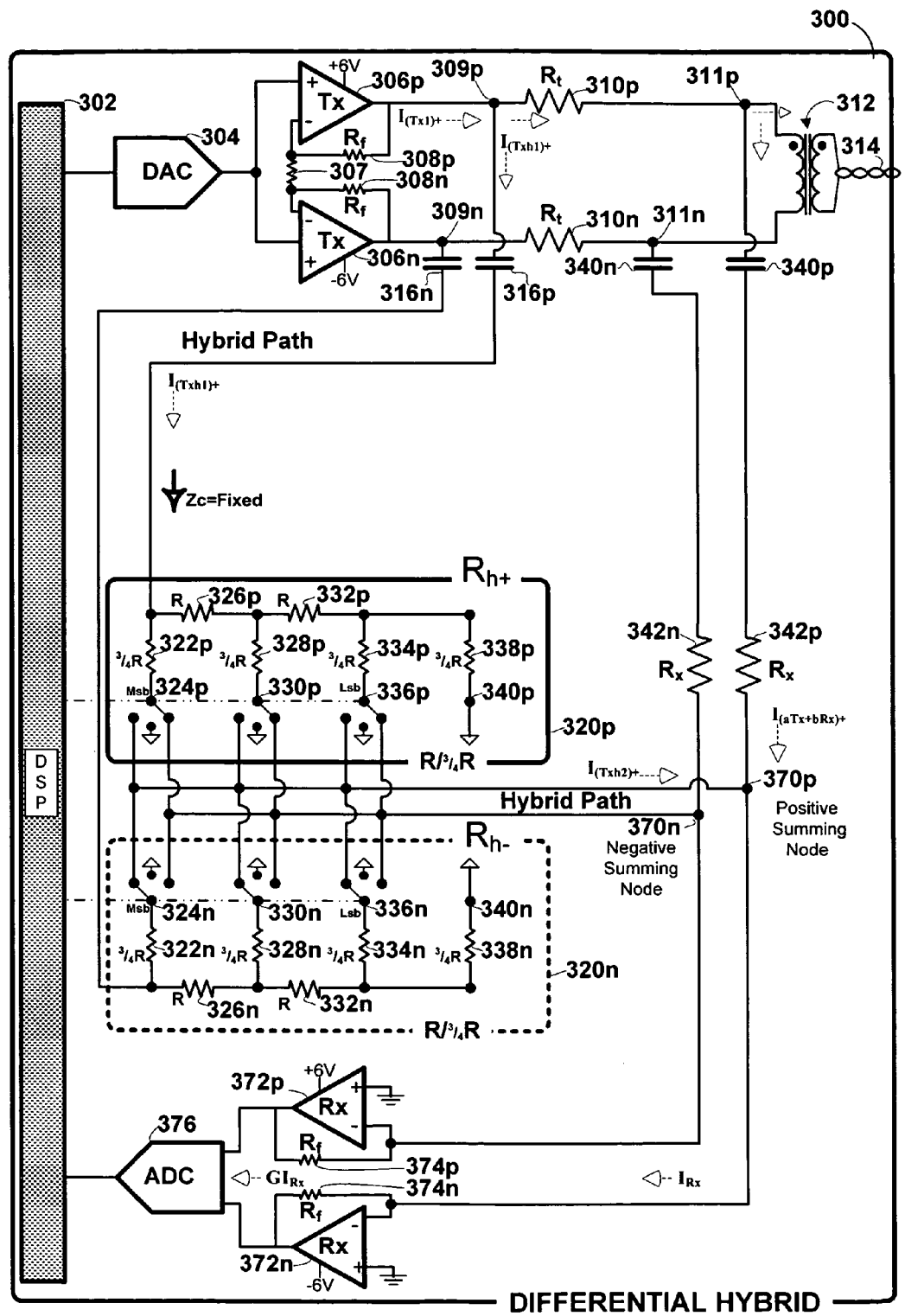
FIG. 3  Current Controller for Hybrid

METHOD AND APPARATUS FOR A CURRENT CONTROL

CROSS REFERENCE TO RELATED APPLICATION

This application claims the benefit of prior filed Provisional Application No. 61/296,612 filed on Jan. 20, 2010 entitled "Non-Binary Weighted Ladder" which is incorporated herein by reference in its entirety as if fully set forth herein.

BACKGROUND OF THE INVENTION

1. Field of Invention

The field of the present invention relates in general to current controllers and more particularly to current controllers in digital modems.

2. Description of the Related Art

Current controllers are a basic building block of electrical circuits serving as: digital to analog converters, programmable attenuators, programmable gain controls, signal/noise cancellers, balancing circuits, digital potentiometers and data converters or quantizers for example. They are often implemented as switchable resistor or attenuator arrays in an integrated circuit. The required resistors and switches occupy significant amount of chip area and introduce other non-idealities such as distortions and stray capacitance. Some implementations also produce redundant states. It is often hard to find a number of available states that is neither too large nor too small for the application.

What is needed is a current controller with reduced distortion and scale.

SUMMARY OF THE INVENTION

The present invention provides a method and apparatus for a current controller particularly suited to differential electrical circuits where its reduced scale and distortion can be fully exploited. In an embodiment of the invention a current controller comprising: discrete impedance elements, single pole triple throw switches, three discrete current sources or sinks and a digital driver is disclosed. The discrete impedance elements are coupled to one another to form at least one impedance ladder circuit configured to exhibit a fixed impedance at an input and current divider steps each differing in a current magnitude by a multiple of three with respect to the current magnitude in an adjacent less significant step. The single pole triple throw (SPTT) switches each include a control input, a current input and three outputs, and each current input coupled to an associated one of the discrete impedance elements associated with each step of the impedance ladder circuit to switchably couple the associated step to a selected one of the three outputs. The three discrete current sources or sinks are each coupled to a corresponding one of the outputs of each of the SPTT switches. The digital driver is coupled to each control input of each SPIT switch to additively deliver selected ones of the stepped currents from each step of the impedance ladder circuit formed by the discrete input elements to a corresponding selected one of the current sources or sinks.

In another embodiment of the invention a hybrid front end for a DSL modem is disclosed which includes the current controllers.

The invention may be implemented in hardware, firmware or software.

Associated methods and means are also disclosed.

BRIEF DESCRIPTION OF THE DRAWINGS

These and other features and advantages of the present invention will become more apparent to those skilled in the art from the following detailed description in conjunction with the appended drawings in which:

FIG. 1A, 1B, 1C, 1D are detailed hardware block diagrams of an embodiment of the current controller of the present invention.

FIGS. 2A, 2B, 2C, 2D, 2E, 2F are detailed hardware block diagrams of an embodiment of the current controller of the present invention in a hybrid front end of a DSL modem.

FIG. 3 is a detailed hardware block diagram of an alternate embodiment of the current controller of the present invention in a hybrid front end of a DSL modem.

DETAILED DESCRIPTION OF THE EMBODIMENTS

Figure 2B:
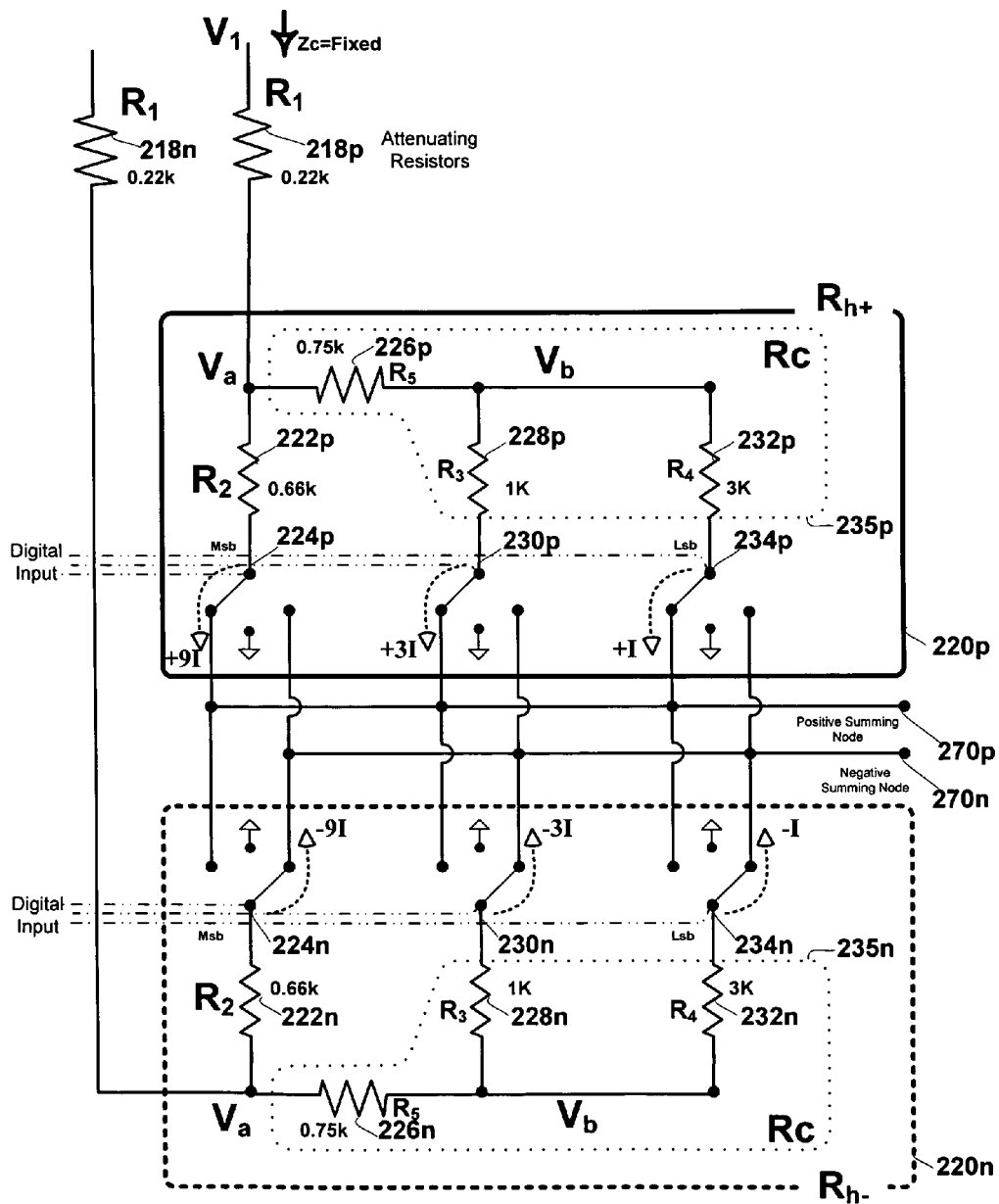
Figure 2C:
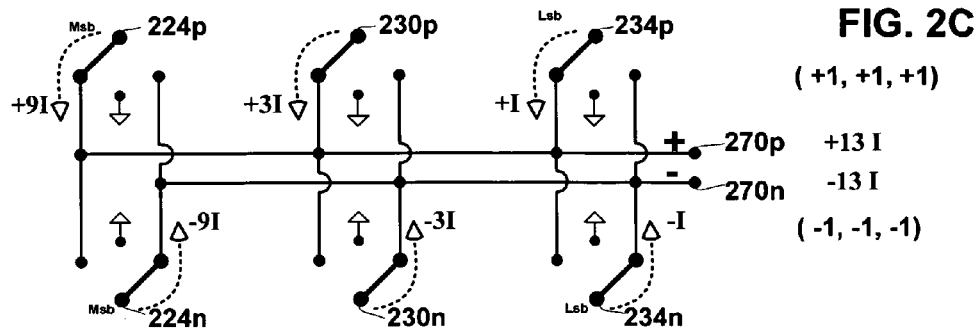
Figure 2D:
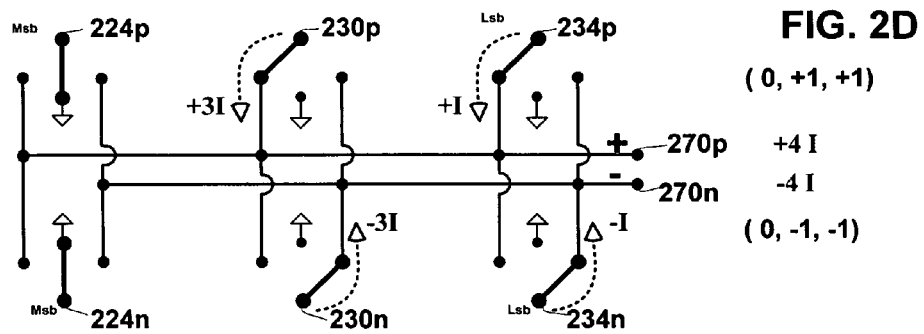
Figure 2E:
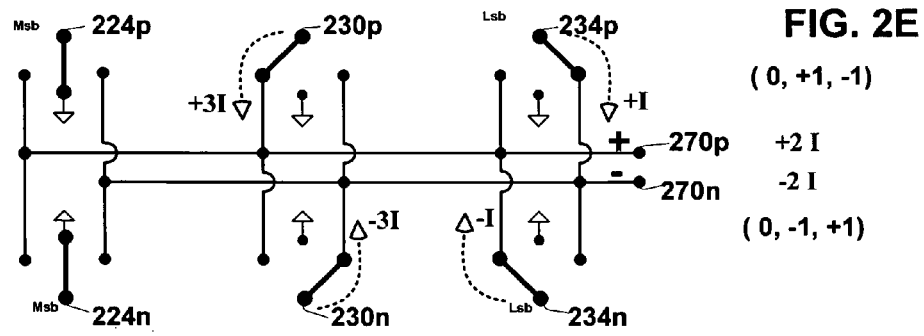
Figure 2F:
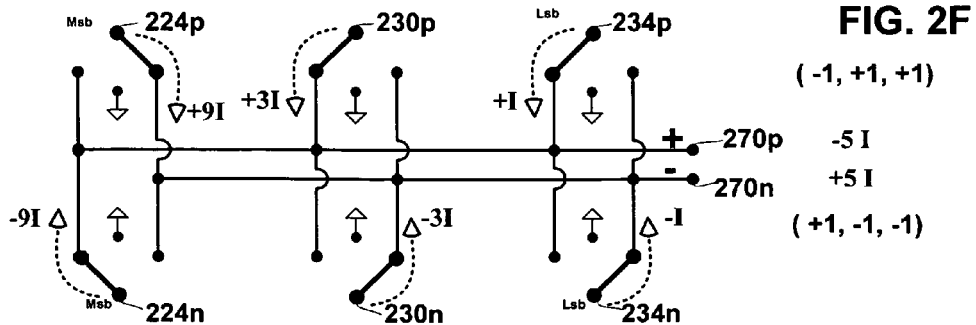

FIG. 1A is a detailed hardware block diagrams of an embodiment of the current controller of the present invention. The controller 100 includes an input 102, a digital control input 103, and a set of six outputs 136, 142, 148, 154, 160, and 166 each of which includes 3 discrete poles. In an embodiment of the invention the 3 discrete poles of each output are coupled to three current sources or sinks 170, e.g. the positive, negative and common/ground nodes of a differential circuit of which they are a part. The set of six outputs are ordered from most to least significant from left to right and are further characterized as base 3 outputs in as much as the magnitude of the current delivered by each output increases in magnitude by a multiple of three, i.e. triples, with respect to the current magnitude in an adjacent less significant output. In an embodiment of the invention input 102 exhibits a fixed impedance and may be coupled to either a fixed current/voltage source or a varying voltage/current source, a.k.a. a signal source. When the input of the current controller is coupled to a varying voltage/current source it may be used to control the amplitude or gain or polarity of a resulting signal at the outputs. Applications include: gain control and current balancing. When the input of the current controller is coupled to a fixed voltage/current source it may be used to drive discretely quantized current levels at the outputs in correspondence with the digital sequence at the digital input 103. Applications include: current steering and data quantization.

The digital control input in an embodiment of the invention couples a digital input to the controller to switch the currents from each output onto one of the three nodes thereof, coupled to an associated one of the three current sources or sinks. The current level on any one of the current sources or sinks is the aggregate of the switched currents from each output. The controller is responsive to a digital input to switch selectable, uniformly granular amounts of currents onto each source or sink. The internal architecture of the controller allows these features to be achieved with a minimum of components when compared with prior art designs.

Internally the controller includes discrete impedance elements configured to form an impedance ladder circuit exhibiting a fixed impedance at the input and currents which increase by a multiple of three between adjacent steps in the ladder. Impedances 104, 106, 108, 110, 114, 116, 118, 120, 124 and 126 are shown forming such ladder. The characteristics of the ladder as well as the constant input impedance thereof are the result of specific design choices as to the values of each impedance, a discussion of which is provided in the following portions of the specification. The controller is characterized as a base 3 controller. This characterization results from the fact that currents at each output triple with respect to an adjacent less significant output and thus correspond in magnitude to the digits of a base 3 number system, e.g. from most to least significant $3^{n-1}, 3^{n-2}, 3^{n-3}, 3^{n-4}, 3^{n-5}, 3^{n-6}$ . . . where n is the number of triple pole outputs. In the example shown in FIG. 1A there are 6 outputs with the result that relative switchable current magnitudes at each output are: $3^5 I, 3^4 I, 3^3 I, 3^2 I, 3^1 I, 3^0 I$ where I is the switchable current supplied by the least significant step of the impedance ladder circuit to the least significant output, e.g. output 166.

Each step of the impedance ladder circuit is coupled to a corresponding one of the single pole triple throw switches. The most significant step of which $Z_9$ reference 106 is a part is coupled to SP3T switch 132. The next most significant step of which $Z_7$ reference 110 is a part is coupled to SP3T switch 138. The next most significant step of which $Z_5$ reference 116 is a part is coupled to SP3T switch 144. The next most significant step of which $Z_3$ reference 120 is a part is coupled to SP3T switch 150. The next most significant step of which $Z_1$ reference 124 is a part is coupled to SP3T switch 156. The least significant step of which $Z_0$ reference 126 is a part is coupled to SP3T switch 162. Each switch includes a control input for the associated bit of the digital number driving the digital input. In an embodiment of the invention the digital input number(s) used to drive the input are themselves expressed in base 3 notation. In that embodiment of the invention bit registers 130 equal in number to the number of switches are provided with each register coupled to a corresponding one of the switches and specifically the control input thereof. In the embodiment shown in FIG. 1A the most significant bit register D5 is coupled to the control input 134 of the most significant switch 132. The next most significant bit register D4 is coupled to the control input 140 of switch 138. The next most significant bit register D3 is coupled to the control input 146 of switch 144. The next most significant bit register D2 is coupled to the control input 152 of switch 150. The next most significant bit register D1 is coupled to the control input 158 of switch 156. The least significant bit register D0 is coupled to the control input 164 of switch 162.

The internal architecture of the current control is further characterized as including intermediate impedance ladder sections formed by impedances: 108-110, 114-116, 118-120 and 122-124 as well as a most and least significant end sections. The design of these end sections exhibit minor variations depending on the application. Where attenuation of the input current or voltage source is required impedance $Z_{10}$ reference 104 may be used to attenuate the current at node 105 and the least significant section can be switchably coupled to one of the three current sources or sinks. Where attenuation is not required as part of the most significant end section impedance $Z_{10}$ reference 104 may not be required. Additionally, switch 162 may be dispensed with in the least significant section, instead terminating the ladder directly to ground.

The current controller of the current invention may include any number of sections consistent with the required range and granularity of the subject application without departing from the scope of the claimed invention.

FIGS. 1B and 1C are exploded hardware block diagrams of alternate embodiments of the impedance elements shown in FIG. 1A. In FIG. 1B the impedance element 108 shown in FIG. 1A comprises a resistor 174. In FIG. 1C the impedance element 110 shown in FIG. 1A comprises an RLC circuit including inductor 178, capacitor 180 and resistor 182.

FIG. 1D is an exploded hardware block diagram of an embodiment of a representative one of the single pole triple throw (SP3T or SPTT) switches shown in FIG. IA. Switch 132 shown in FIG. 1A is implemented with field effect transistors 184, 186 and 188 each coupling the current input 180 from the corresponding step in the impedance ladder shown in FIG. 1A to a corresponding one of the three output nodes 136. The switches are individually controlled at input 134 so as to connect the input 180 to only one output pole at a time.

FIG. 2A is a detailed hardware block diagram of an embodiment of the current controller of the present invention in a hybrid front end of a DSL modem 200. A transmit signal source comprising differentially coupled op amps 206p-206n, and a receive signal amplifier comprising differentially coupled op amps 272p-272n are shown.

A differential hybrid, a.k.a. balancing circuit is shown coupling the transmit signal source and the receive signal amplifier to the primary inductor of transformer 212 which is in turn coupled at a secondary inductor portion thereof to the subscriber line 214. The balancing circuit includes components forming a differential hybrid path which provides a signal inversely proportional to an amount of leakage of the transmit signal into the receive signal at corresponding differential summing nodes 270p-270n on the receive path, thereby allowing transmit signal leakage to be removed from the receive signal prior to amplification in the receive signal amplifier.

The differential hybrid path components include a differential pair of current controllers 220p-220n in accordance with an embodiment of the invention. Each current controller includes a fixed impedance input coupled to the transmit signal source, a switch control input and successive triple pole outputs each configured to deliver currents corresponding to the transmit signal in amounts differing in magnitude by a multiple of three with respect to an adjacent less significant switch. Each switch is configured to switchably couple to a selected one of the positive 270p and negative 270n differential summing nodes on the receive path or to a ground to switchably provide at the differential summing nodes differential currents an aggregate of which substantially corresponds inversely with an amount of leakage of the transmit signal into the receive signal, thereby substantially removing leakage from the receive signal.

In the embodiment of the invention shown in FIG. 2A the receive path also includes a differential pair of current controllers 250p-250n which work in conjunction with their counterparts on the hybrid path to provide both leakage reduction as well as attenuation of the transmit signal. The current controllers on both the receive and hybrid paths include impedance ladders with base 3 current architecture including SP3T switches at each significant output in accordance with the claimed invention.

Typically the balancing of the circuit occurs during the training phase of modem operation with the established current settings utilized subsequently during the showtime phase of modem operation.

In operation a transmit signal is delivered from DSP 202 to digital-to-analog converter (DAC) 204. The differential op-amps 206p-206n couple to the output of the DAC. Resistors 208p, 208n, and 207 are used to establish the gain of the differential transmit amplifier. The receive signal as 'cleaned up' at the differential summing nodes 270p-270n is input to the receive amplifier. The receive amplifier comprises op-amps 272p-272n differentially coupled to one another. The gain of the receive amplifier is established via resistors 274p-274n. The amplified receive signal is input to the analog-to-digital converter 276 the output of which is supplied to the DSP 202 for further processing including demodulation. The balancing circuit includes 6 nodes. The differential hybrid path commences at balance nodes 209p-209n which are resistively coupled to the primary of the inductor. The receive path commences at balance nodes 211p-211n which are also coupled to the primary inductor of the transformer and resistively separated from the nodes at the start of the hybrid path via resistors 210p-210n. Additional blocking capacitors 216n-216p and 240p-240n are used to block DC currents into the balancing circuit. Next on the differential hybrid path a pair of resistors 218n-218p are used to provide the impedance required to attenuate the transmit signal on the hybrid path to avoid clipping and distortion thereof. Next, the above discussed current controllers 220p-220n in a differential configuration allow uniform and granular control of the amount of the attenuated transmit signal that will be provided to the final pair of balance nodes, i.e. the summing nodes 270p-270n. Current controller 220p includes impedance elements 222p, 226p, 228p, 232p configured to form an impedance ladder each step of which is switchably coupled via SP3T switches 224p, 230p, 234p to either of the summing nodes 270n-270p or to a common mode voltage, a.k.a. an AC ground. Current controller 220n includes impedance elements 222n, 226n, 228n, 232n also configured to form an impedance ladder each step of which is switchably coupled via SP3T switches 224n, 230n, 234n to either of the summing nodes 270n-270p or to a common mode voltage, a.k.a. an AC ground.

The receive path which commences at balance nodes 211p-211n also includes a differential pair of resistors 242n-242p are used to provide the impedance which may be required to attenuate the receive path signal. Next current controllers 250p-250n in a differential configuration allow uniform and granular control of the amount of the attenuated receive path signal that will be provided to the final pair of balance nodes, i.e. the summing nodes 270n-270p. Current controller 250n includes impedance elements 252n, 256n, 258n, 262n also configured to form an impedance ladder each step of which is switchably coupled via SP3T switches 254n, 260n, 264n to either of the summing nodes 270n-270p or to or to a common mode voltage, a.k.a. an AC ground. Current controller 250p includes impedance elements 252p, 256p, 258p, 262p configured to form an impedance ladder each step of which is switchably coupled via SP3T switches 254p, 260p, 264p to either of the summing nodes 270n-270p or to or to a common mode voltage, a.k.a. an AC ground.

FIG. 2B is a detailed hardware block diagrams of an embodiment of the current controller of the present invention in a hybrid front end of a DSL modem. General design considerations for a base 3 current controller will be set forth. The base 3 differential current controllers of FIG. 2A are shown with additional details. Input voltage V1, attenuating impedance R1, impedance ladder rail voltages Va and Vb, are shown at corresponding locations in the controller. An additional impedance parameter Rc is shown. Rc corresponds to the combined input impedance of resistors R3 reference 228p, R4 reference 232p and R5 reference 226p. Rc also corresponds to the input impedance Zc including the attenuating resistor R1 reference 218p. The following equations express the required constraints for the base 3 current controller the satisfaction of which results in the fixed impedance and base 3 stepped currents by which the device is characterized.

$$Rc = R1 + R2 \| Rc \quad \text{Equation 1}$$

$$\frac{Va}{V1} = \frac{R2 \| Rc}{R1 + R2 \| Rc} \quad \text{Equation 2}$$

$$Rc = \frac{R1 \cdot \left(1 + \sqrt{1 + 4 \cdot \frac{R2}{R1}}\right)}{2} \quad \text{Equation 3}$$

$$\frac{V1}{Va} = 1 + \frac{R1}{Rc} + \frac{R1}{R2} \quad \text{Equation 4}$$

The following shows a design methodology for a representative base 3 current controller in accordance with an embodiment of the invention, and corresponds to the impedance values shown in FIG. 2B.

Goal:

Set the input impedance=Zc=4R3

Va=2Vb=0.5 Volts

Currents through R2, R3, R4 are 9I, 3I and I respectively.

Solution: If we set resistor R3 to a value of 1 k$\Omega$ then we can determine the value of R4 given the common voltage Vb between these two parallel steps in the impedance ladder circuit. Since Vb=3I×R3 and Vb=I×R4 resistor R4 will have a value 3 times larger than that of R3 or in the example shown 3 k$\Omega$. Next, R5 can be determined. Since Va is twice Vb and R5 is in series with parallel resistors R3∥R4 it follows that R5 has the same value as the parallel resistances R3∥R4. The total resistance of R3 is in parallel with R4 is 1/(1/R3+1/R4) or ($\frac{3}{4}$)R3. Therefore R5 equals ($\frac{3}{4}$)R3 or 0.75 k$\Omega$. Next R2 can be calculated. The current flow through R5 is that required to feed both steps R3 and R4 of the impedance ladder circuit, i.e. 4I. The current flow through the step which includes R2 is targeted at 9I. Both current flows are driven by the common voltage Va. So the resistance of R2 will have to be significantly less than the combined resistance of the series parallel combination of R5 and R3∥R4 in order to provide the higher current through the R2 step. Specifically, Va/((6/4)R3)=4I= ($\frac{4}{9}$)9I=($\frac{4}{9}$)Va/R2. Therefore R2 is $\frac{2}{3}$ of R3 or 0.66 k$\Omega$. R1 is identified as an attenuating resistor chosen in relation to the strength of the transmission signal to avoid clipping thereof at the input Va of the Impedance ladder circuit within current controller 220p.

The input impedance at node Va and excluding R1 is $$R2 \| (R5 + (R3 \| R4)) = R2 \| 2R5 = (2/3) \| (3/2)R3 = (6/13) * R3$$

or in the example shown approximately 0.46 k$\Omega$.

Changes in the value of the Attenuating resistor R1 alter the per stage attenuation of the current divider while maintaining the given base 3 current flow relationships between adjacent steps in the impedance ladder circuit as shown in the following table. Analyzing the ladder structures under the infinite ladder condition, i.e Rin=Rc=R1+R2∥Rc we get the quadratic equation: $Rc^2 - R1Rc - R1R2 = 0$. The positive solution gives $$Rc = \frac{R1 \cdot \left(1 + \sqrt{1 + 4 \cdot \frac{R2}{R1}}\right)}{2}$$

We can calculate the attenuation per stage as (R2∥R)/(R1+R2∥R) and assemble the following Table 1.

TABLE 1

| R2/R1 | $Rc = \frac{1 + \sqrt{1 + 4\frac{R_2}{R_1}}}{2}$ | Attenuation Stage |
|---|---|---|
| 0.30 | 1.24 | 0.19 |
| 0.50 | 1.37 | 0.27 |
| 0.75 | 1.50 | 0.33 |
| 1.00 | 1.62 | 0.38 |
| 1.50 | 1.82 | 0.45 |
| 2.00 | 2.00 | 0.50 |
| 2.50 | 2.16 | 0.54 |
| 3.00 | 2.30 | 0.57 |
| 3.50 | 2.44 | 0.59 |
| 3.75 | 2.50 | 0.60 |
| 4.00 | 2.56 | 0.61 |

If R2/R1=0.75 each stage attenuates the voltage of the previous stage by a factor of 3. In this case, each branch will have the same value of resistance and we still obtain currents weighted by powers of 3.

FIGS. 2C, 2D, 2E, 2F are detailed hardware block diagrams of switch configurations for the base 3 current controllers shown in FIG. 2A. The reference numbers are the same used in FIG. 2A. They provide $3^3$=27 different output current combinations four of which are shown in FIGS. 2C, 2D, 2E and 2F. Generally the number of current combinations supported by a current controller increases with the number of steps in the controller as $3^n$ where n is the number of switched steps. Opposing switches of the same significance in the pair of differential current controllers operate generally as follows. If the current in the "positive" path is steered to the "negative in" rail, the lower branch current is steered to the "positive in" rail and vice versa. If the current in the "positive" path is steered to ground, the lower branch current is also steered to the ground. The switches of different significance operate independently of one another.

The following table sets forth all positive going states. The remaining 13 inverted switch states are not shown.

TABLE 2

| Positive Supply | | | Negative Supply | | | |
|---|---|---|---|---|---|---|
| Msb 9I | 3I | Lsb 1I | Msb −9I | −3I | Lsb −1I | SWING (+/−)I |
| 1 | 1 | 1 | −1 | −1 | −1 | 13 |
| 1 | 1 | 0 | −1 | −1 | 0 | 12 |
| 1 | 1 | −1 | −1 | −1 | 1 | 11 |
| 1 | 0 | 1 | −1 | 0 | −1 | 10 |
| 1 | 0 | 0 | −1 | 0 | 0 | 9 |
| 1 | 0 | −1 | −1 | 0 | 1 | 8 |
| 1 | −1 | 1 | −1 | 1 | −1 | 7 |
| 1 | −1 | 0 | −1 | 1 | 0 | 6 |
| 1 | −1 | −1 | −1 | 1 | 1 | 5 |
| 0 | 1 | 1 | 0 | −1 | −1 | 4 |
| 0 | 1 | 0 | 0 | −1 | 0 | 3 |
| 0 | 1 | −1 | 0 | −1 | 1 | 2 |
| 0 | 0 | 1 | 0 | 0 | −1 | 1 |
| 0 | 0 | 0 | 0 | 0 | 0 | 0 |

FIG. 3 is a detailed hardware block diagram of an alternate embodiment of the current controller of the present invention in a hybrid front end of a DSL modem 300 with a base 3 current controller exhibiting more uniformity in the impedance values of the impedances which form the impedance ladder circuit. This results from the presence of a termination to ground rather than a switch on the least significant section of the ladder. Terminations 340p-340n are shown serving this function in the differential controller pair 320p-320n. Additionally, the differential hybrid balancing circuit does not include an attenuating resistor on the hybrid path, and therefore no current controllers are required on the receive path. The current controllers 320p-320n are designed using the same considerations discussed above in connection with FIG. 2B. Due to the presence of the termination to ground on the least significant stage the resistors on the steps have a value of ¾R while the resistors on the rail have a value of R. Once again, current increases by a multiple of 3 between adjacent steps of the impedance ladder. Current in each successive branch from most to least significant switch is:

$$\frac{\frac{1}{1}V_a}{0.75R} + \frac{\frac{1}{3}V_a}{0.75R} + \frac{\frac{1}{9}V_a}{0.75R} + \ldots \frac{\frac{1}{3_{n-1}}V_a}{0.75R}$$

where Va is the voltage at the input of the impedance ladder and n is the step number starting from the most significant switch which has the number 1. The ladder input impedance can be made constant. For example, it is constant when the rails are connected to either a summing node or the common mode voltage, the "vertical" resistors are weighted proportionally to 3, the "horizontal" resistors are proportional to 4 and the termination is proportional to 6. In this example the input impedance will be proportional to 2 and the voltage as we move down each section is attenuated by a factor of 3.

A transmit signal source comprising differentially coupled op amps 306p-306n, and a receive signal amplifier comprising differentially coupled op amps 372p-372n are shown.

A differential hybrid, a.k.a. balancing circuit is shown coupling the transmit signal source and the receive signal amplifier to the primary inductor of transformer 312 which is in turn coupled at a secondary inductor portion thereof to the subscriber line 314. The balancing circuit includes components forming a differential hybrid path which provides a signal inversely proportional to an amount of leakage of the transmit signal into the receive signal at corresponding differential summing nodes 370p-370n on the receive path, thereby allowing transmit signal leakage to be removed from the receive signal prior to amplification in the receive signal amplifier.

The differential hybrid path components include a differential pair of current controllers 320p-320n in accordance with an embodiment of the invention. Each current controller includes a fixed impedance input coupled to the transmit signal source, a switch control input and successive triple pole outputs each configured to deliver currents corresponding to the transmit signal in amounts differing in magnitude by a multiple of three with respect to an adjacent less significant switch. Each switch is configured to switchably couple to a selected one of the positive 370p and negative 370n differential summing nodes on the receive path or to a ground to switchably provide at the differential summing nodes differential currents an aggregate of which substantially corresponds inversely with an amount of leakage of the transmit signal into the receive signal, thereby substantially removing leakage from the receive signal.

The current controllers on the hybrid path include impedance ladders with base 3 current architecture including SP3T switches at each significant output in accordance with the claimed invention.

Typically the balancing of the circuit occurs during the training phase of modem operation with the established current settings utilized subsequently during the showtime phase of modem operation.

In operation a transmit signal is delivered from DSP 302 to digital-to-analog converter (DAC) 304. The differential op-amps 306*p*-306*n* couple to the output of the DAC. Resistors 308*p*, 308*n*, and 307 are used to establish the gain of the differential transmit amplifier. The receive signal as 'cleaned up' at the differential summing nodes 370*p*-370*n* is input to the receive amplifier. The receive amplifier comprises op-amps 372*p*-372*n* differentially coupled to one another. The gain of the receive amplifier is established via resistors 374*p*-374*n*. The amplified receive signal is input to the analog-to-digital converter 376 the output of which is supplied to the DSP 302 for further processing including demodulation. The balancing circuit includes 6 balancing nodes. The differential hybrid path commences at balance nodes 309*p*-309*n* which are resistively coupled to the primary of the inductor. The receive path commences at balance nodes 311*p*-311*n* which are also coupled to the primary inductor of the transformer and resistively separated from the nodes at the start of the hybrid path via resistors 310*p*-310*n*. Additional blocking capacitors 316*n*-316*p* and 340*p*-340*n* are used to block DC currents into the balancing circuit. Next on the differential hybrid path the above discussed current controllers 320*p*-320*n* in a differential configuration allow uniform and granular control of the amount of the attenuated transmit signal that will be provided to the final pair of balance nodes, i.e. the summing nodes 370*p*-370*n*. Current controller 320*p* includes impedance elements 322*p*, 326*p*, 328*p*, 332*p*, 334*p*, 338*p* configured to form an impedance ladder each step of which is switchably coupled via SP3T switches 324*p*, 330*p*, 336*p* to either of the summing nodes 370*n*-370*p* or to a common mode voltage, a.k.a. an AC ground. Current controller 320*n* includes impedance elements 322*n*, 326*n*, 328*n*, 332*n*, 334*n*, 338*n* also configured to form an impedance ladder each step of which is switchably coupled via SP3T switches 324*n*, 330*n*, 336*n* to either of the summing nodes 370*n*-370*p* or to a common mode voltage, a.k.a. an AC ground.

The receive path which commences at balance nodes 311*p*-311*n* includes a differential pair of resistors 342*n*-342*p* to provide the impedance which may be required to attenuate the receive path signal at summing nodes 370*n*-370*p*.

Figure 4:
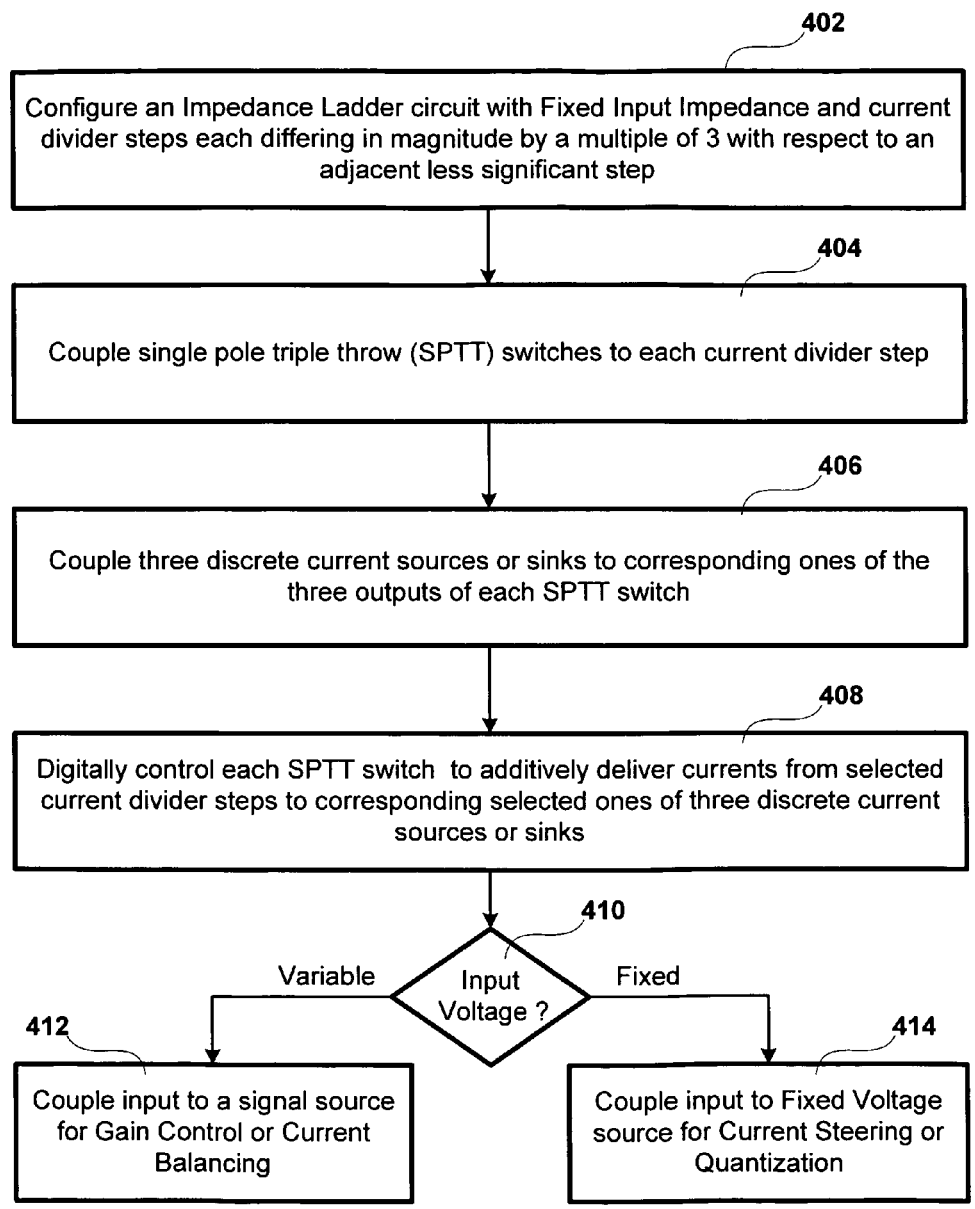
FIG. 4 is a process flow diagram of processes associated with current control in accordance with an embodiment of the present invention.

FIG. 4 is a process flow diagram of processes associated with current control in accordance with an embodiment of the present invention. Processing commences in process 402 with the configuration of an impedance ladder circuit with fixed input impedance and current divider steps each differing in magnitude by a multiple of 3 with respect to an adjacent less significant step. Next in process 404 single pole triple throw (SPTT or SP3T) switches are coupled to each current divider step. Then in process 406 three discrete current sources or sinks are coupled to corresponding ones of the three outputs of each SPTT switch. Subsequently in process 408 each SPTT switch is digitally controlled to additively deliver currents from selected current divider steps to corresponding selected ones of the three discrete current sources or sinks. In the following decision process 410 a determination is made as to whether the input voltage to the impedance ladder circuit is fixed or variable. If fixed then in process 414 the input is coupled to the fixed voltage source for current steering or quantization. Alternately if in decision process 414 a determination is made that the input is coupled to a variable current source then in process 412 the input is coupled to the signal source for gain control or current balancing.

The components and processes disclosed herein may be implemented as software, hardware, firmware, or a combination thereof, without departing from the scope of the Claimed invention.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A current controller comprising:
   discrete impedance elements coupled to one another to form at least one impedance ladder circuit configured to exhibit a fixed impedance at an input and current divider steps each differing in a current magnitude by a multiple of three with respect to the current magnitude in an adjacent less significant step;
   single pole triple throw (SPTT) switches each including a control input, a current input and three outputs, and each current input coupled to an associated one of the discrete impedance elements associated with each step of the impedance ladder circuit to switchably couple the associated step to a selected one of the three outputs;
   three discrete current sources or sinks each coupled to a corresponding one of the outputs of each of the SPTT switches; and
   a digital driver coupled to each control input of each SPTT switch to additively deliver selected ones of the stepped currents from each step of the impedance ladder circuit formed by the discrete input elements to a corresponding selected one of the current sources or sinks.

2. The current controller of claim 1, wherein further:
   the discrete impedance elements couple to one another to form two impedance ladder circuits each exhibiting a fixed input impedance at an associated input and each step of each of the two impedance ladder circuits exhibiting a current magnitude differing in amount by a multiple of three with respect to a current magnitude in an adjacent less significant step.

3. The current controller of claim 1, wherein further:
   the discrete impedance elements couple to one another to form two impedance ladder circuits each exhibiting a fixed input impedance at an associated input and each step of each of the two impedance ladder circuits exhibiting a current magnitude differing in amount by a multiple of three with respect to a current magnitude in an adjacent less significant step; and
   the three discrete current sources or sinks comprise a positive summing node, a negative summing node and a ground of a differential circuit.

4. The current controller of claim 1, further comprising:
   a fixed voltage or current source coupled to the input of the impedance ladder circuit formed by the discrete impedance elements, whereby the digital driver incrementally controls current levels on each of the three discrete current sources coupled to the switches.

5. The current controller of claim 1, further comprising:
   a signal source exhibiting varying voltages coupled to the input of the impedance ladder circuit formed by the discrete impedance elements, whereby the digital driver incrementally controls gain of input signal source on each of the three discrete current sources or sinks at outputs of switch.

6. The current controller of claim 1, wherein further the discrete impedance elements comprise resistors.

7. The current controller of claim 1, wherein the digital driver includes:
bit registers coupled in order of significance to a control input of a corresponding one of the SPTT switches and the bit registers driven by numbers in a radix or base three, thereby providing three discrete inputs per SPTT switch.

8. A method of controlling current, comprising:
coupling discrete impedance elements to one another to form at least one impedance ladder circuit which exhibits a fixed impedance at an input and current divider steps each differing in a current magnitude by a multiple of three with respect to the current magnitude in an adjacent less significant step;
switchably coupling each current divider step to a selected one of three discrete current sources or sinks;
coupling three discrete current sources or sinks to corresponding ones of the three outputs of each SPTT switch; and
digitally controlling each SPTT switch to additively deliver currents from selected current divider steps of the impedance ladder circuit formed in the first coupling act to corresponding selected ones of the three discrete current sources or sinks.

9. A differential hybrid circuit for communicating a differential transmit signal from a differential transmit signal source and a differential receive signal across a digital subscriber line, and the hybrid circuit comprising:
a transformer with a primary and a secondary inductor and the primary inductor coupled to the differential transmit signal source and the secondary inductor coupled to the subscriber line; and
a balance circuit differentially coupling the transmit signal to and the receive signal from the primary inductor and the balancing circuit including components forming a differential hybrid path for providing a signal inversely proportional to an amount of leakage of the transmit signal into the receive signal at corresponding differential summing nodes thereof on the receive path; and the balance circuit hybrid path components including:
a differential pair of current controllers each including a fixed impedance input coupled to the transmit signal source, a switch control input and successive triple pole outputs each configured to deliver currents corresponding to the transmit signal in amounts differing in magnitude by a multiple of three with respect to an adjacent less significant switch, and each switch configured to switchably couple to a selected one of the positive and negative differential nodes or to a ground to switchably provide at the differential summing nodes differential currents an aggregate of which substantially corresponds inversely with an amount of leakage of the transmit signal into the receive signal, thereby substantially removing leakage from the receive signal.

10. The differential hybrid circuit of claim 9 wherein the differential pair of current controllers further comprise:
discrete impedance elements coupled to one another to form a pair of impedance ladder circuits configured to exhibit a fixed impedance at an input and current divider steps each differing in a current magnitude by a multiple of three with respect to the current magnitude in an adjacent less significant step;
single pole triple throw (SPTT) switches each including the control input, a current input and the three outputs, and each current input coupled to an associated one of the discrete impedance elements associated with each step of the impedance ladder circuit to switchably couple the associated step to a selected one of the three outputs; and
a digital driver coupled to each control input of each SPTT switch to additively deliver selected ones of the stepped currents from each step of the impedance ladder circuit formed by the discrete input elements to a corresponding selected one of the differential nodes or the ground.

11. The differential hybrid circuit of claim 10, wherein further the discrete impedance elements comprise resistors.

12. The differential hybrid circuit of claim 10, wherein the digital driver includes:
bit registers coupled in order of significance to a control input of a corresponding one of the SPTT switches and the bit registers driven by numbers in a radix or base three, thereby providing three discrete inputs per SPTT switch.

13. An apparatus comprising:
a signal source input that presents a fixed impedance;
a digital control input;
a plurality of switch elements coupled to the signal source input and the digital control input, each of the switch elements providing respective differential outputs having respective different magnitudes corresponding to the signal source input; and
a pair of differential summing nodes,
wherein the digital control input selectively causes the differential outputs of one and only one of the plurality of switch elements to couple to the pair of differential summing nodes.

14. An apparatus according to claim 13, wherein each of the switch elements comprises an impedance coupled to a single pole triple throw switch.

15. An apparatus according to claim 14, wherein the impedances of the plurality of switch elements are arranged to form an impedance ladder.

* * * * *

UNITED STATES PATENT AND TRADEMARK OFFICE
CERTIFICATE OF CORRECTION

| | | |
|---|---|---|
| PATENT NO. | : 8,947,282 B1 | Page 1 of 1 |
| APPLICATION NO. | : 12/931018 | |
| DATED | : February 3, 2015 | |
| INVENTOR(S) | : Fuks et al. | |

It is certified that error appears in the above-identified patent and that said Letters Patent is hereby corrected as shown below:

Specification

In Column 1, Line 60, delete "each SPIT" and insert -- each SPTT --, therefor.

In Column 4, Line 6, delete "FIG. IA." and insert -- FIG. 1A. --, therefor.

In Column 4, Line 55, delete "with the claimed invention." and insert -- with embodiments of the invention. --, therefor.

Signed and Sealed this
Third Day of November, 2015

Michelle K. Lee
*Director of the United States Patent and Trademark Office*